(12) United States Patent  
Tsuneoka et al.

(10) Patent No.: US 7,161,252 B2
(45) Date of Patent: Jan. 9, 2007

(54) MODULE COMPONENT

(75) Inventors: Michiaki Tsuneoka, Osaka (JP); Koji Hashimoto, Hyogo (JP); Masaaki Hayama, Nara (JP); Takeo Yasuho, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 18 days.

(21) Appl. No.: 10/485,540

(22) PCT Filed: Jun. 16, 2003

(86) PCT No.: PCT/JP03/07598

§ 371 (c)(1),
(2), (4) Date: Feb. 2, 2004

(87) PCT Pub. No.: WO2004/010499

PCT Pub. Date: Jan. 29, 2004

(65) Prior Publication Data

US 2004/0232452 A1    Nov. 25, 2004

(30) Foreign Application Priority Data

Jul. 19, 2002  (JP) .............................. 2002-210750

(51) Int. Cl.
*H01L 23/28* (2006.01)

(52) U.S. Cl. ...................... 257/787; 257/100; 257/788; 257/789; 257/790; 257/E23.125; 257/E23.126

(58) Field of Classification Search ................ 257/297, 257/422, 659–660, 100, 433, 434, 667, 687, 257/767–796, E23.125, E23.126, E23.127, 257/E23.128

See application file for complete search history.

(56) References Cited

U.S. PATENT DOCUMENTS

| 5,153,379 | A | * | 10/1992 | Guzuk et al. ............. 174/35 R |
| 5,166,772 | A | | 11/1992 | Soldner et al. |
| 5,311,059 | A | | 5/1994 | Banerji et al. |
| 6,049,469 | A | * | 4/2000 | Hood et al. .................. 361/818 |
| 6,388,535 | B1 | * | 5/2002 | Otsuki et al. ............ 331/177 R |
| 6,469,380 | B1 | * | 10/2002 | Sorimachi et al. .......... 257/706 |
| 6,483,175 | B1 | * | 11/2002 | Yoshida ...................... 257/665 |
| 6,487,088 | B1 | * | 11/2002 | Asai et al. .................. 361/794 |
| 6,512,183 | B1 | * | 1/2003 | Mitani et al. ............... 174/257 |
| 6,585,149 | B1 | * | 7/2003 | Nakatsuka et al. ...... 228/180.1 |

FOREIGN PATENT DOCUMENTS

| EP | 1 160 859 A2 | 12/2001 |
| EP | 1 175 138 | 1/2002 |
| JP | 03-179796 | 8/1991 |
| JP | 08-288686 | 11/1996 |
| JP | 10-214923 | 8/1998 |
| JP | 11-163583 | 6/1999 |

(Continued)

*Primary Examiner*—Andy Huynh
(74) *Attorney, Agent, or Firm*—McDermott Will & Emery LLP

(57) ABSTRACT

A module includes a component, a circuit board having the component mounted thereon, a first grounding pattern formed on an outermost periphery of a surface portion of the circuit board; a first sealer provided on the circuit board and having a dimension projected on the circuit board, and a metal film covering the sealer and connected to the grounding pattern. The dimension of the first dealer is smaller than an outside dimension of the circuit board. The first sealer is made of first resin and sealing the component. The module has a low profile and is adequately shielded.

14 Claims, 5 Drawing Sheets

FOREIGN PATENT DOCUMENTS

| | | |
|---|---|---|
| JP | 11163583 A * | 6/1999 |
| JP | 2001-244688 | 9/2001 |
| WO | WO 94/18707 | 8/1994 |

* cited by examiner

MODULE COMPONENT

TECHNICAL FIELD

The invention relates to a component module used for various electronic equipment and communications equipment.

BACKGROUND ART

A conventional component module illustrated in FIG. 9 includes circuit board 21 mounting component 23 at least on a side of the board, grounding electrode 24 having a recess shape formed on a side of circuit board 21, and metal case 22 covering mounted component 23. Metal case 22 has a terminal inserted and connected to grounding electrode 24 with a solder to electrically shield the module.

Since metal case 22 is soldered to the side of circuit board 21 of the conventional component module, circuit board 21 needs to have a thickness to support metal case 22. Metal case 22 may contact component 23 mounted on circuit board 21, thus causing short-circuiting, or may apply an external stress to the board, thus causing malfunction of a circuit. Therefore, metal case 22 is taller than component 23 for avoiding such incidents. Additionally, since the terminal of metal case 22 is connected to a terminal component on the side of circuit board 21 at several points, a clearance between circuit board 21 and metal case 22 is needed for preventing metal case 22 from contact a circuit pattern and component 23 on board 21. This structure prevents the module from being thin and from manufactured easily, and prevents the case from providing a sufficient shielding effect.

SUMMARY OF THE INVENTION

A module includes a component, a circuit board having the component mounted thereon, a first grounding pattern formed on an outermost periphery of a surface portion of the circuit board; a first sealer provided on the circuit board and having a dimension projected on the circuit board, and a metal film covering the sealer and connected to the grounding pattern. The dimension of the first dealer is smaller than an outside dimension of the circuit board. The first sealer is made of first resin and sealing the component.

The module has a low profile and is adequately shielded.

DETAILED DESCRIPTION OF PREFERRED EMBODIMENTS

Exemplary Embodiment 1

Figure 1:
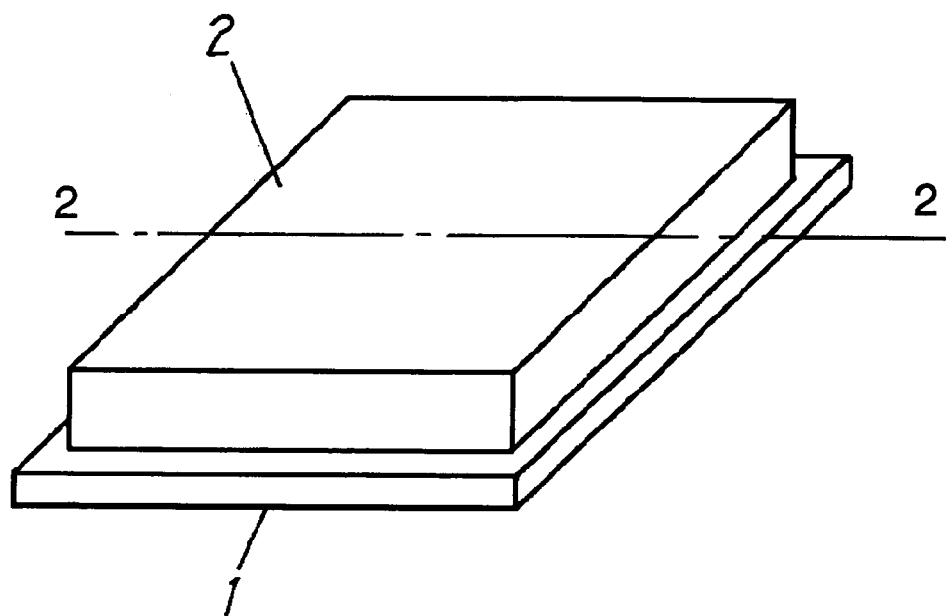
FIG. 1 is a perspective view of a component module in accordance with Exemplary Embodiment 1 of the present invention.
Figure 2:
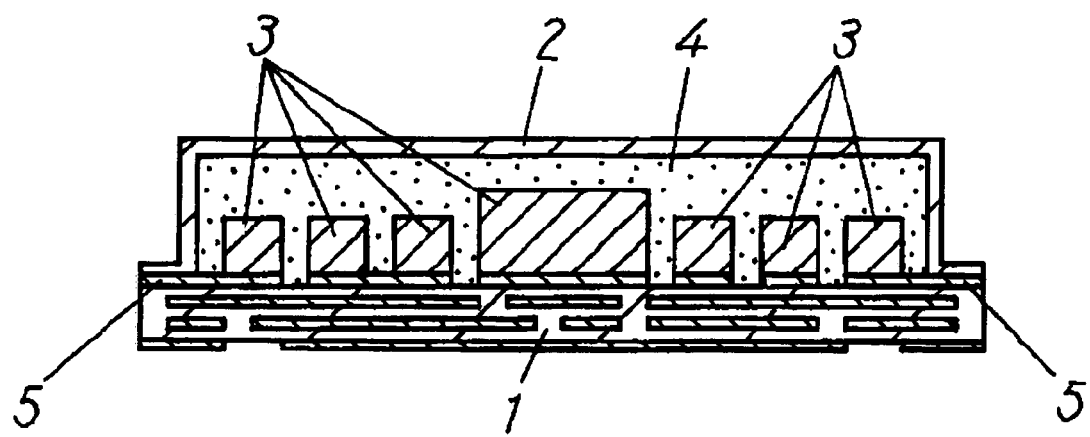
FIG. 2 is a cross-sectional view of the module along line 2—2 shown in FIG. 1.

FIG. 1 is a perspective view of a component module in accordance with Exemplary Embodiment 1 of the present invention. FIG. 2 is a cross-sectional view of the module at line 2—2 shown in FIG. 1. Circuit board 1 is made of a multi-layer printed circuit board including at least two wiring layers having a power supply circuit, a grounding pattern, and a high-frequency circuit formed on the layers. Components 3, such as a resistor, a capacitor, a coil, a semiconductor, and a crystal connected to the board with lead-free solder are mounted on circuit board 1. Sealer 4 made of epoxy resin has a dimension projected on board 1 smaller than an outer dimension of circuit board 1 and is formed on circuit board 1 and covers components 3. Metal film 2 is provided on sealer 4. Metal film 2 is connected to first grounding pattern 5 formed on four sides of an outermost periphery of a surface portion 1A of circuit board 1.

Figure 3:
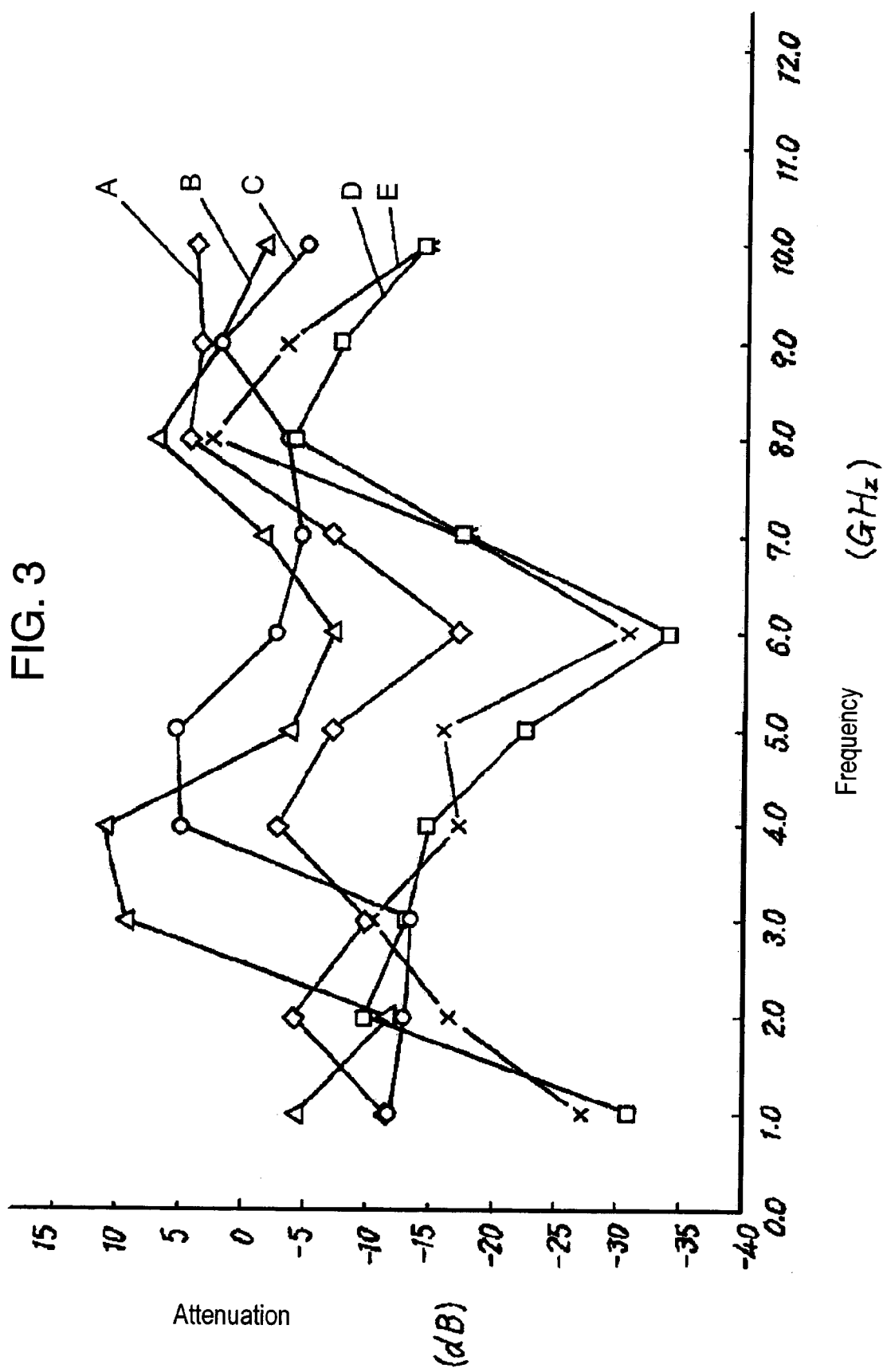
FIG. 3 is a chart for comparing shielding effects of modules.

FIG. 3 is a chart for comparing shielding effects of various component modules with reference to a component module which includes sealer 4 and does not include metal film 2. Sample A is a conventional component module including a metal case. Sample B includes grounding pattern 5 at two shorter sides of circuit board 1. Sample C includes grounding pattern 5 provided at four corners of circuit board 1. Sample D includes grounding pattern 5 provided at four sides of circuit board 1. Sample E includes grounding pattern 5 provided at two longer sides of circuit board 1. Sample D, which includes grounding pattern 5 provided at four sides of circuit board 1, has a shielding effect larger than that of sample A, the conventional module including the metal case.

As shown in FIG. 3, the module covered with metal film 2 connected to grounding pattern 5 provided at several points has a large shielding effect. The module covered with metal film 2 connected to grounding pattern 5 provided at the four corners has particularly a large shielding effect.

As shown in FIG. 2, metal film 2 is connected to grounding pattern 5 formed on the surface portion 1A of the circuit board 1. Metal film 2 may be connected to a side of grounding pattern 5 formed on an outer periphery of a surface portion 1B of circuit board 1, as shown in FIG. 4.

Figure 8:
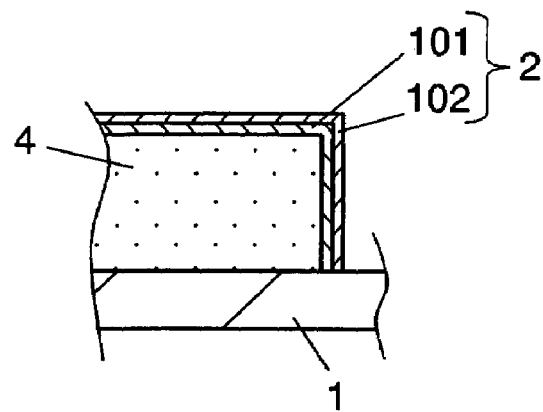
FIG. 8 is an enlarged view of the module in accordance with Embodiment 1.
Figure 9:
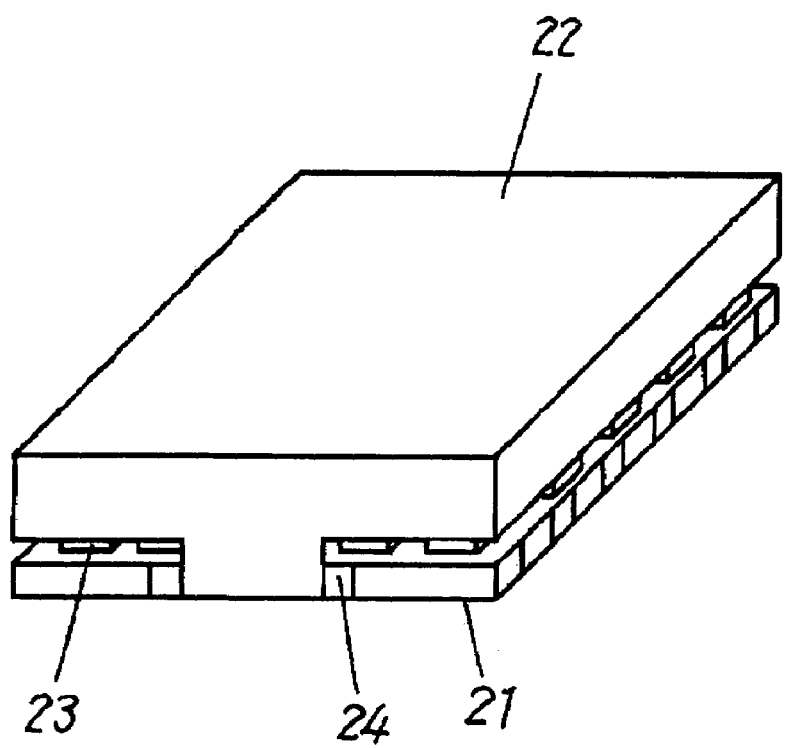
FIG. 9 is a perspective view of a conventional component module.

Metal film 2 having a thickness greater than about 1 μm provides a sufficient shielding effect. As illustrated in FIG. 8, metal film 101 is formed by a non-electrolytic plating method with copper, and finer metal film 102 is formed by an electrolytic plating method, and thus, the films 101 and 102 provides the metal film 2. This structure allows metal film 2 to have a small contact resistance and stabilizes a grounding voltage at metal film 2, thus enhancing the shielding effect.

Figure 4:
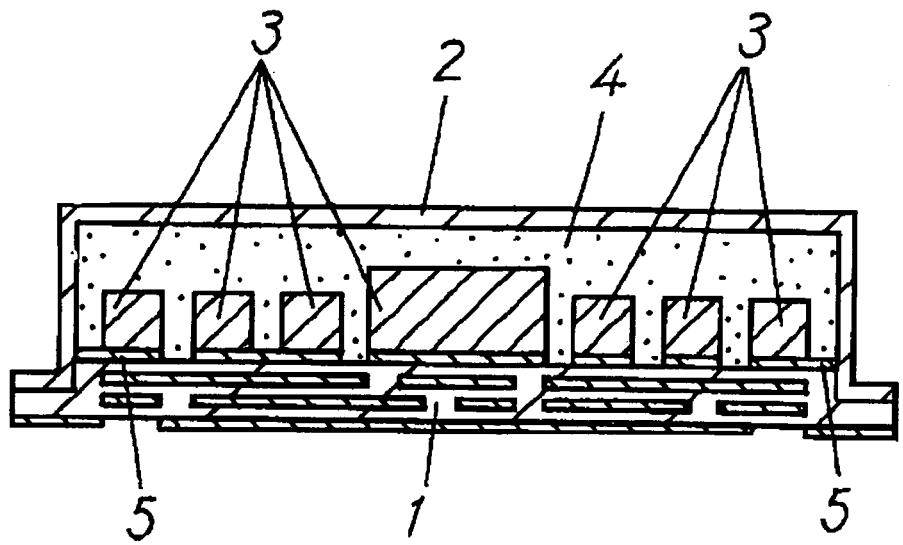
FIG. 4 is a cross-sectional view of another component module in accordance with Embodiment 1.

As shown in FIGS. 2 and 4, the dimension of sealer 4, which is covered with metal film 2, projected on circuit board 1 is larger than the dimension of the circuit board. A step is formed between circuit board 1 to sealer 4. The step improves adhesion between metal film 2 composed of non-electrolytic plate and electrolytic plate and sealer 4 or circuit board 1, preventing the metal film from being peeled off from sealer 4 or grounding pattern 5. Thus, metal film 2 on sealer 4 which is connected to grounding pattern 5 on circuit board 1 securely shields a circuit of circuit board 1 including components 3.

The components may be connected to the circuit board with lead-free solder, thus allowing the module to keep a connection of the circuit when the module is mounted on a mother board and to keep the shielding effect.

The components may be connected to the circuit board with conductive adhesive, thus allowing the module to keep a connection of the circuit when the module is mounted on a mother board and to keep the shielding effect.

A clearance provided between the circuit board and the components may be sealed with resin. The resin eliminates air in the clearance, thereby securing a reliability of the module and keeping the shielding effect.

Exemplary Embodiment 2

Figure 5:
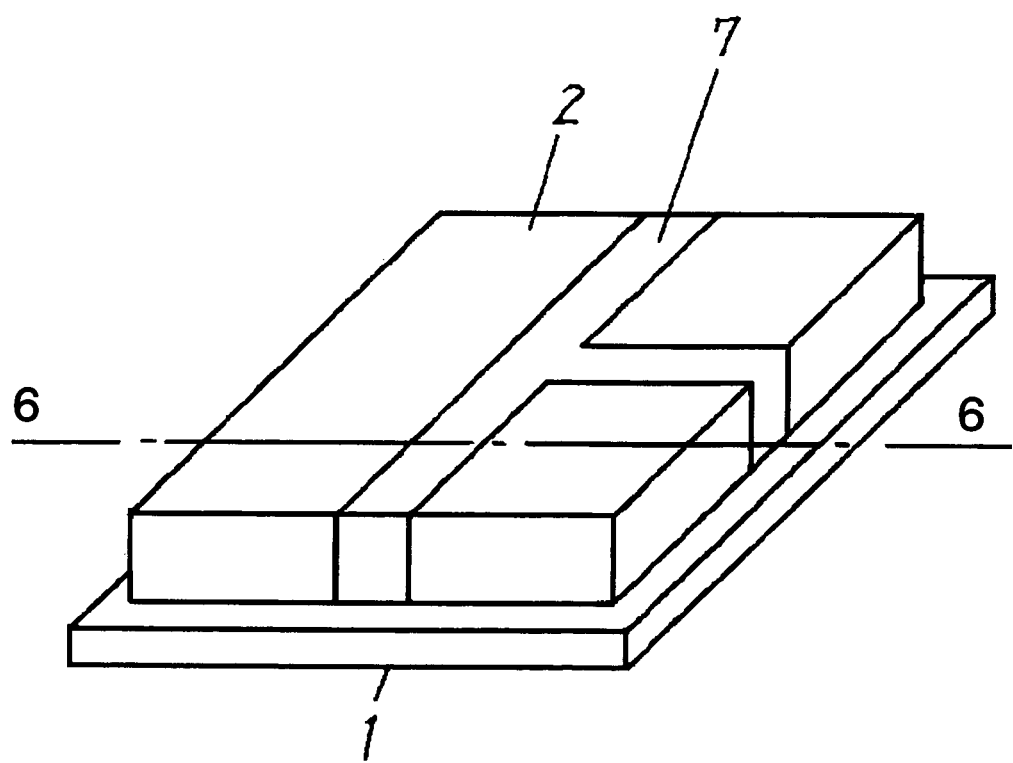
FIG. 5 is a perspective view of a component module in accordance with Exemplary Embodiment 2 of the invention.
Figure 6:
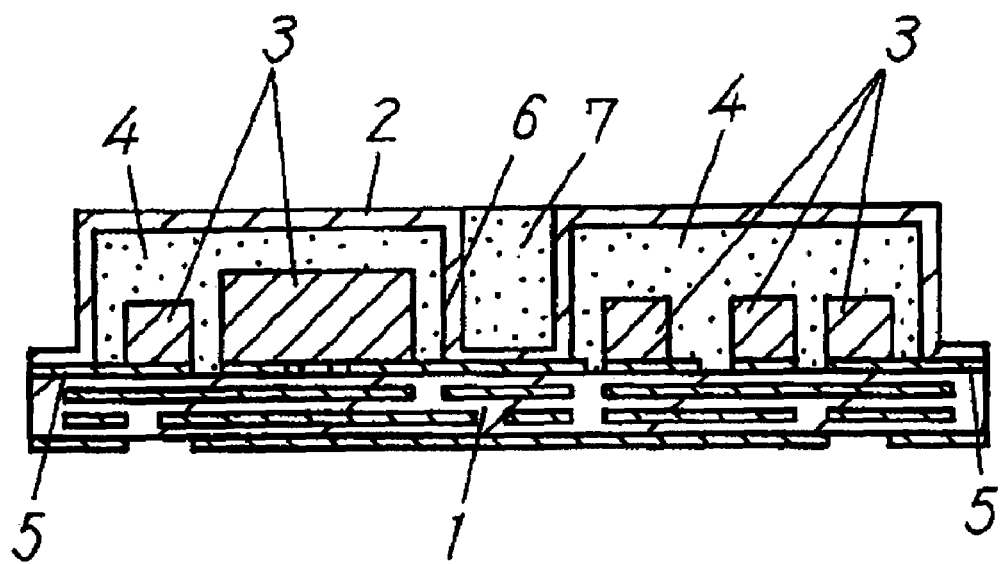
FIG. 6 is a cross-sectional view of the module at line 6—6 shown in FIG. 5.

FIG. 5 is a perspective view of a component module in accordance with Exemplary Embodiment 2 of the present invention. FIG. 6 is a cross-sectional view of the module at line 6—6 shown in FIG. 5. As illustrated in FIG. 5, in the module in accordance with Embodiment 2, sealer 4 covered with metal film 2 is divided into three blocks by sealer 7 made of second resin.

As shown in FIG. 6, a power supply circuit, a ground pattern and a high-frequency circuit described in Embodiment 1 are formed on at least two wiring layers of circuit board 1. First grounding pattern 5 is formed on an outer periphery of the circuit board.

Components 3, such as a resistor, a capacitor, a transistor, and a crystal are mounted on circuit board 1. Sealer 4 covering components 3 has a dimension projected on circuit board 1 which is smaller than an outer dimension of circuit board 1 and is formed on circuit board 1. Sealer 4 has dividing ditch 6 provided therein for separating the circuit board into circuit blocks.

Metal film 2 provided on sealer 4 and dividing ditch 6 is connected to a surface of grounding pattern 5. Dividing ditch 6 is filled with sealer 7 of the second resin on metal film 2.

As described, components 3 are separated into the blocks by dividing ditch 6. Each block is covered with sealer 4 and a portion of metal film 2 provided on each block. Metal film 2 is connected to first grounding pattern 5, so that each circuit block is electrically shielded from other circuit blocks. This structure provides a small component module including the circuit blocks protected from electrical noise interference of other blocks.

Dividing ditch 6 is filled with the second resin, forming sealer 7 of the module. This structure provides a thin component module with a large strength against bending, thus preventing the module from warping. This structure thus secures connection reliability between metal film 2 and grounding pattern 5, and ensures an effective shielding performance.

Figure 7:
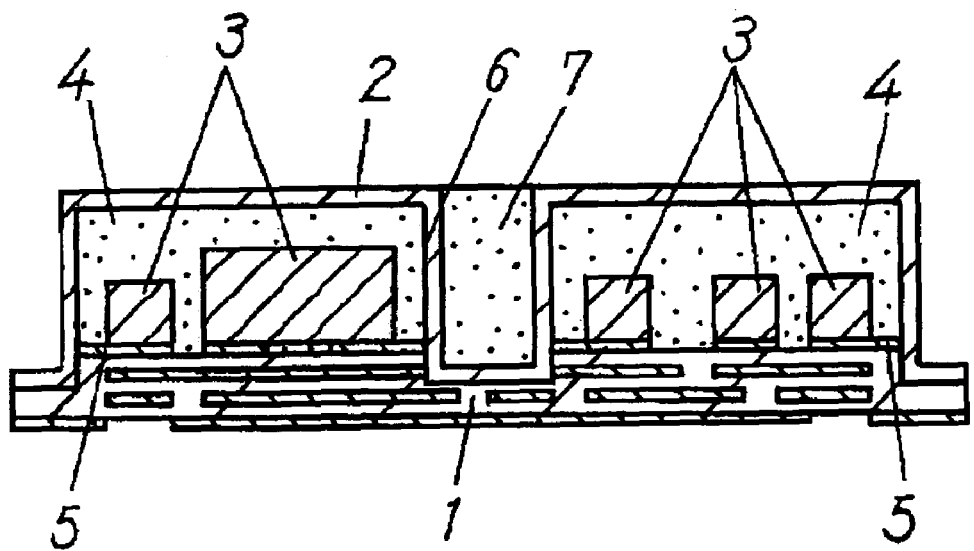
FIG. 7 is a cross-sectional view of another component module in accordance with Embodiment 2.

In another component module shown in FIG. 7, metal film 2 covers the sealer and the board to a depth within the thickness of circuit board 1. The metal film shields a portion of patterns formed inside circuit board 1, and provides a shielding effect larger than the module shown in FIG. 6.

Metal film 2 and grounding pattern 5 of the circuit board may be connected either at a bottom or at a side of the dividing ditch of sealer 4. This structure enhances a shielding effect for each circuit block.

INDUSTRIAL APPLICABILITY

A component module in accordance with the present invention has a small size and has a high shielding effect.

The invention claimed is:

1. A module comprising:
   a component;
   a circuit board having the component mounted thereon;
   a first grounding pattern formed on four sides of an outermost periphery of a surface portion of the circuit board;
   a first sealer provided on the circuit board and having a dimension projected on the circuit board, the dimension being smaller than an outside dimension of the circuit board, the first sealer being made of first resin and sealing the component;
   a metal film covering the first sealer and connected to the grounding pattern; and
   a second grounding pattern provided on the surface portion of the circuit board, wherein the first sealer has a dividing ditch formed therein corresponding to circuit blocks,
   wherein the metal film is connected to the second grounding pattern through at least one of a bottom and a side of the dividing ditch.

2. The module according to claim 1, wherein the surface portion of the circuit board is smaller than the outer dimension of the circuit board, and the metal film is connected onto a side of the grounding pattern.

3. The module according to claim 1, further comprising a second sealer made of second resin for filling the dividing ditch.

4. The module according to claim 1, wherein the metal film includes,
   a first film plated on the first sealer by a non-electrolytic plating method, and
   a second film plated on the first film by an electrolytic plating method.

5. The module according to claim 1, further comprising a lead-free solder for connecting the circuit board to the component.

6. The module according to claim 1, further comprising a conductive adhesive for connecting the circuit board to the component.

7. The module according to claim 1, further including a third resin sealing a clearance between the circuit board and the component.

8. A module comprising:
   a component;
   a circuit board having the component mounted thereon;
   a first grounding pattern formed on an outermost periphery of a surface portion of the circuit board;
   a first sealer provided on the circuit board and having a dimension projected on the circuit board, the dimension being smaller than an outside dimension of the circuit board, the first sealer being made of first resin and sealing the component;
   a metal film covering the first sealer and connected to the grounding pattern; and
   a second grounding pattern provided on the surface portion of the circuit board,
   wherein the first sealer has a dividing ditch formed therein corresponding to circuit blocks, and
   the metal film is connected to the second grounding pattern through at least one of a bottom and a side of the dividing ditch.

9. The module according to claim 8, wherein the surface portion of the circuit board is smaller than the outside dimension of the circuit board, and the metal film is connected onto a side of the grounding pattern.

10. The module according to claim 8, further comprising a second sealer made of second resin for filling the dividing ditch.

11. The module according to claim 8, wherein the metal film includes,
   a first film plated on the first sealer by a non-electrolytic plating method, and
   a second film plated on the first film by an electrolytic plating method.

12. The module according to claim 8, further comprising a lead-free solder for connecting the circuit board to the component.

13. The module according to claim 8, further comprising a conductive adhesive for connecting the circuit board to the component.

14. The module according to claim 8, further including a third resin sealing a clearance between the circuit board and the component.

* * * * *